United States Patent
Cyril et al.

(10) Patent No.: US 10,729,050 B2
(45) Date of Patent: Jul. 28, 2020

(54) FINE PITCH COMPONENT PLACEMENT ON PRINTED CIRCUIT BOARDS

(71) Applicant: SEAGATE TECHNOLOGY LLC, Cupertino, CA (US)

(72) Inventors: Vimal Cyril, Karnataka (IN); Subramanian Ramanathan, Karnataka (IN)

(73) Assignee: Seagate Technology LLC, Fremont, CA (US)

(*) Notice: Subject to any disclaimer, the term of this patent is extended or adjusted under 35 U.S.C. 154(b) by 0 days.

(21) Appl. No.: 15/814,733

(22) Filed: Nov. 16, 2017

(65) Prior Publication Data

US 2019/0150334 A1    May 16, 2019

(51) Int. Cl.
| | | |
|---|---|---|
| *H01R 9/00* | (2006.01) | |
| *H05K 13/04* | (2006.01) | |
| *H05K 3/30* | (2006.01) | |
| *H05K 1/11* | (2006.01) | |
| *H05K 3/40* | (2006.01) | |
| *H05K 3/34* | (2006.01) | |

(52) U.S. Cl.
CPC .......... *H05K 13/046* (2013.01); *H05K 1/112* (2013.01); *H05K 1/115* (2013.01); *H05K 3/303* (2013.01); *H05K 3/4038* (2013.01); *H05K 3/3442* (2013.01); *H05K 2201/09381* (2013.01); *H05K 2201/09409* (2013.01); *H05K 2201/09609* (2013.01); *H05K 2201/10712* (2013.01); *H05K 2201/10954* (2013.01)

(58) Field of Classification Search
CPC ...... H05K 1/023; H05K 1/0231; H05K 1/114; H05K 1/116; H05K 1/181; H05K 2201/10015; H05K 2201/10636; H05K 2201/10674; H05K 2201/10734; H05K 3/3442; Y02P 70/611

See application file for complete search history.

(56) References Cited

U.S. PATENT DOCUMENTS

| | | | |
|---|---|---|---|
| 5,764,485 | A | 6/1998 | Lebaschi |
| 6,300,578 | B1 | 10/2001 | Hoffmeyer et al. |
| 6,833,615 | B2 | 12/2004 | Geng et al. |
| 7,602,615 | B2* | 10/2009 | Chan ............... H05K 1/0231 174/261 |
| 2005/0162839 | A1* | 7/2005 | Chan ............... H05K 1/0231 361/782 |
| 2006/0166398 | A1* | 7/2006 | Chan ............... H01L 23/49816 438/106 |
| 2007/0177364 | A1* | 8/2007 | Larsen ............... H05K 1/0231 361/760 |
| 2016/0066424 | A1* | 3/2016 | Ao .................. H05K 1/113 174/261 |
| 2017/0142831 | A1* | 5/2017 | Chan ............... H05K 1/181 |

* cited by examiner

*Primary Examiner* — Yuriy Semenenko
(74) *Attorney, Agent, or Firm* — Kagan Binder, PLLC (57) ABSTRACT

Systems and methods for fine pitch component placement on printed circuit boards are described. In one embodiment, a printed circuit board includes multiple vias and multiple of electrically conductive pads. The multiple vias include at least a first via and a second via. The multiple electrically conductive pads include a first pad and a second pad. The first pad and/or the second pad may include an electrically conductive material such as copper, silver, gold, or another conductive material. In some cases, the first pad and the second pad each have a reduced width portion positioned between and spaced apart from the first via and the second via.

16 Claims, 7 Drawing Sheets

FINE PITCH COMPONENT PLACEMENT ON PRINTED CIRCUIT BOARDS

SUMMARY

The present disclosure is directed to methods and systems for fine pitch component placement on printed circuit boards. The present systems and methods improve component placement on printed circuit boards, the improved component placement resulting in an increase in power delivery to circuits on the printed circuit board based on the increased proximity between components and vias as well as lowering the cost of manufacturing of the printed circuit boards.

A printed circuit board for fine pitch component placement on printed circuit boards is described. In one embodiment, the printed circuit board may include multiple vias and multiple of electrically conductive pads. The multiple vias may include at least a first via and a second via. The multiple electrically conductive pads may include a first pad and a second pad. The first pad and/or the second pad may include an electrically conductive material such as copper, silver, gold, or another conductive material. In some cases, the first pad and the second pad each have a reduced width portion positioned between and spaced apart from the first via and the second via.

In one embodiment, the second pad mirrors the first pad. In some cases, the first via mirrors the second via. In some embodiments, a mirror line of the first pad and the second pad is orthogonal to a mirror line of the first via and the second via. In one example, the reduced width portion includes a first edge that extends along a portion of a peripheral edge of the first via, and a second edge that extends along a portion of a peripheral edge of the second via.

In some embodiments, the first pad connects electrically to the first via. In some cases, the second pad connects electrically to the second via. Alternatively, the first pad may connect electrically to the second via and the second pad may connect electrically to the first via.

In some embodiments, an electronic component is connected to the first pad and to the second pad. In some cases, the electronic component includes a capacitor, a resistor, or an inductor. In some cases, a first connector of the electronic component connects electrically to the first pad and a second connector of the electronic component connects electrically to the second pad.

In some embodiments, a solder mask surrounds the first pad or the second pad, or both. In some cases, the first and second edges have a contoured shape. In one example, the first pad and the second pad each include at least six edges. In some embodiments, the at least six edges include four or more straight edges and two or more curved edges. In some cases, a curvature of at least one of the two or more curved edges matches a curvature of at least one of the first via and the second via, or a curvature of both the first via and the second via.

In some embodiments, the printed circuit board may include a mounting surface such as a top surface or a bottom surface. In some cases, the first pad and the second pad may be positioned on the mounting surface. In one example, the first via and the second via each include an aperture formed in the mounting surface. In one example, the first pad and the second pad may be spaced apart from the first via and the second via on the mounting surface.

A method for fine pitch component placement on printed circuit boards is also described. The method may be configured to improve a printed circuit board, the printed circuit board having at least first and second vias. The method may include forming a first pad and a second pad on the printed circuit board. In one embodiment, the first pad and the second pad each include an electrically conductive material. In some cases, the first pad and the second pad each have a rectangular shape with first and second truncated corners. In one example, the truncated corners may be arranged spatially between the first via and the second via.

A printed circuit board fabricator for fine pitch component placement on printed circuit boards is also described. In one embodiment, the printed circuit board fabricator may include one or more processors. In some cases the printed circuit board fabricator may include memory in electronic communication with the one or more processors. In one example, instructions may be stored in the memory. In some cases, the instructions may be executable by the one or more processors to perform the steps of forming multiple vias on a printed circuit board and placing a first pad and a second pad on the printed circuit board. In some embodiments, the multiple vias may include at least a first via and a second via. In some cases, the second via may be laterally spaced apart from the first via. In some embodiments, the first pad and the second pad each include an electrically conductive material. In some cases, the first pad and the second pad may be positioned at least in part between the first via and the second via. In one example, the first pad and the second pad each may have a shape that extends around a portion of a perimeter of the first via and a portion of a perimeter of the second via.

The foregoing has outlined rather broadly the features and technical advantages of examples according to this disclosure so that the following detailed description may be better understood. Additional features and advantages will be described below. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, including their organization and method of operation, together with associated advantages will be better understood from the following description when considered in connection with the accompanying figures. Each of the figures is provided for the purpose of illustration and description only, and not as a definition of the limits of the claims.

BRIEF DESCRIPTION OF THE DRAWINGS

A further understanding of the nature and advantages of the present disclosure may be realized by reference to the following drawings. In the appended figures, similar components or features may have the same reference label. Further, various components of the same type may be distinguished by following a first reference label with a dash and a second label that may distinguish among the similar components. However, features discussed for various components, including those having a dash and a second reference label, apply to other similar components. If only the first reference label is used in the specification, the description is applicable to any one of the similar components having the same first reference label irrespective of the second reference label.

DETAILED DESCRIPTION

The following relates generally to fine pitch component placement on printed circuit boards (PCBs). For fine pitch components such as 0.8 mm pitch ball grid array (BGA) devices, layout guidelines recommend mounting capacitors on the PCB underneath the pads. Mounting the capacitors underneath the pads helps to improve power delivery to circuits and chips on the PCB, but doing so requires advanced PCB technology and increases cost based on expensive conventional processes. Conventional processes may include a via in pad plated over (VIPPO) process and/or via sharing of power pins. However, via sharing of power pins impacts power integrity and performance on the affected PCB. Also, VIPPO adds time and cost to PCB assembly and is not recommended on 0201 parts by assembly vendors.

To reduce PCB cost, the present systems and methods provide new footprint layouts for monolithic components such as ceramic capacitors. For example, the footprint layouts of the present systems and methods may be used to place the 0201 capacitor (0.6 mm×0.3 mm) closer to a via than conventional methods. The layout of the footprint of the present systems and methods may be referred to as an hour glass type footprint. In one embodiment, hour glass conductive pads may be placed between BGA vias on a PCB. As one example, a 0201 capacitor may be placed on the hour glass conductive pads between BGA vias. As one example, a PCB may include 0.8 BGA devices. For 0.8 mm BGA devices, vendors recommend placing the decoupling capacitors as close as possible to the power pins/vias. The present systems and methods provide a modified version of a 0201 land pattern/footprint to avoid the problems of VIPPO while still meeting chip vendor's specifications.

The present systems and methods improve upon the conventional PCB assembly. The present systems and methods avoid the expensive VIPPO process, resulting in a savings of 10-15% of fabrication cost. The present systems and methods simplify rework of 0201 capacitors, resulting in a rework process that is more efficient and less time-consuming when replacing affected components on the hour glass conductive pads, and does not introduce any reliability issues. The present systems and methods also enable decoupling capacitors to be placed closer to the device power pins than conventional methods.

Figure 1:
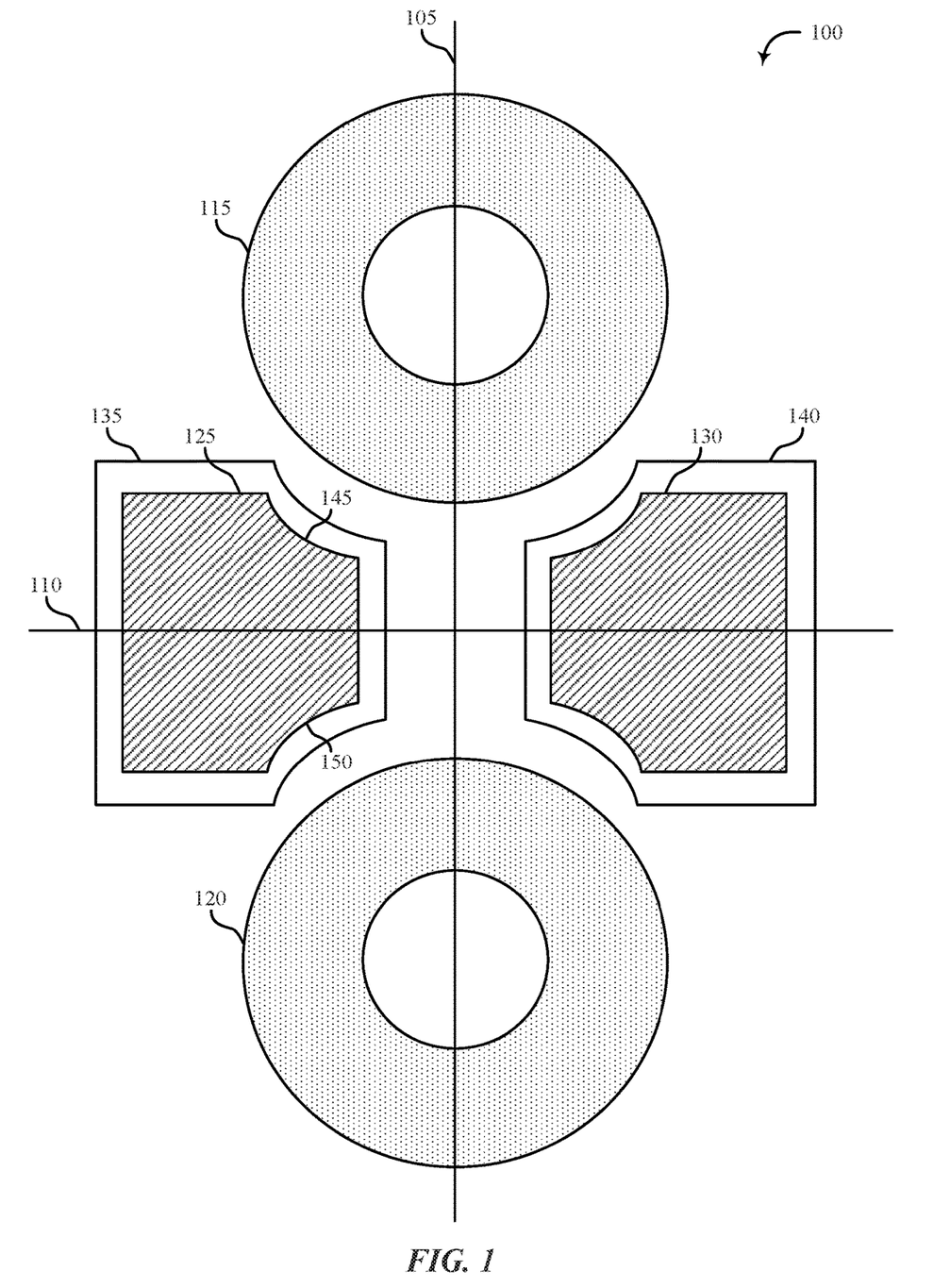
FIG. 1 shows one embodiment of an environment in accordance with various aspects of this disclosure.

FIG. 1 shows an environment 100 for fine pitch component placement on printed circuit boards, in accordance with various examples. At least one aspect of environment 100 may be implemented in conjunction with one or more processors of a computing device and/or one or more processors executing code in conjunction with a PCB fabrication machine.

As depicted, environment 100 includes a via mirror line 105 and a pad mirror line 110. It is noted that via mirror line 105 and pad mirror line 110 are not physical features on a printed circuit board, but rather these mirror lines are provided to illustrate features of the present systems and methods including certain symmetrical features.

As illustrated, environment 100 includes first via 115 and second via 120, first pad 125 and second pad 130, and first solder mask 135 and second solder mask 140. As shown, via mirror line 105 intersects first via 115 and second via 120, while pad mirror line 110 intersects pad 125 and pad 130. As depicted, pad mirror line 110 is orthogonal to via mirror line 105.

In one embodiment, second pad 130 mirrors first pad 125 relative to via mirror line 105. Similarly, second solder mask 140 mirrors first solder mask 135 relative to via mirror line 105. In one embodiment, first via 115 mirrors second via 120 relative to pad mirror line 110.

In one embodiment, first pad 125 includes first indent 145 and second indent 150. As illustrated, second pad 130 includes similar indents. In some cases, first indent 145 and second indent 150 may each be referred to as a reduced width portion of first pad 125. In some embodiments, first indent 145 includes a first edge of first pad 125 that extends along a portion of a peripheral edge of first via 115, as shown. Similarly, in one embodiment second indent 150 includes a second edge of first pad 125 that extends along a portion of a peripheral edge of second via 120. In one embodiment, first indent 145 and second indent 150 include a curved edge. In some cases, first indent 145 and second indent 150 may include a convex or concave edge. Alternatively, first indent 145 and second indent 150 may include a straight edge.

Figure 2:
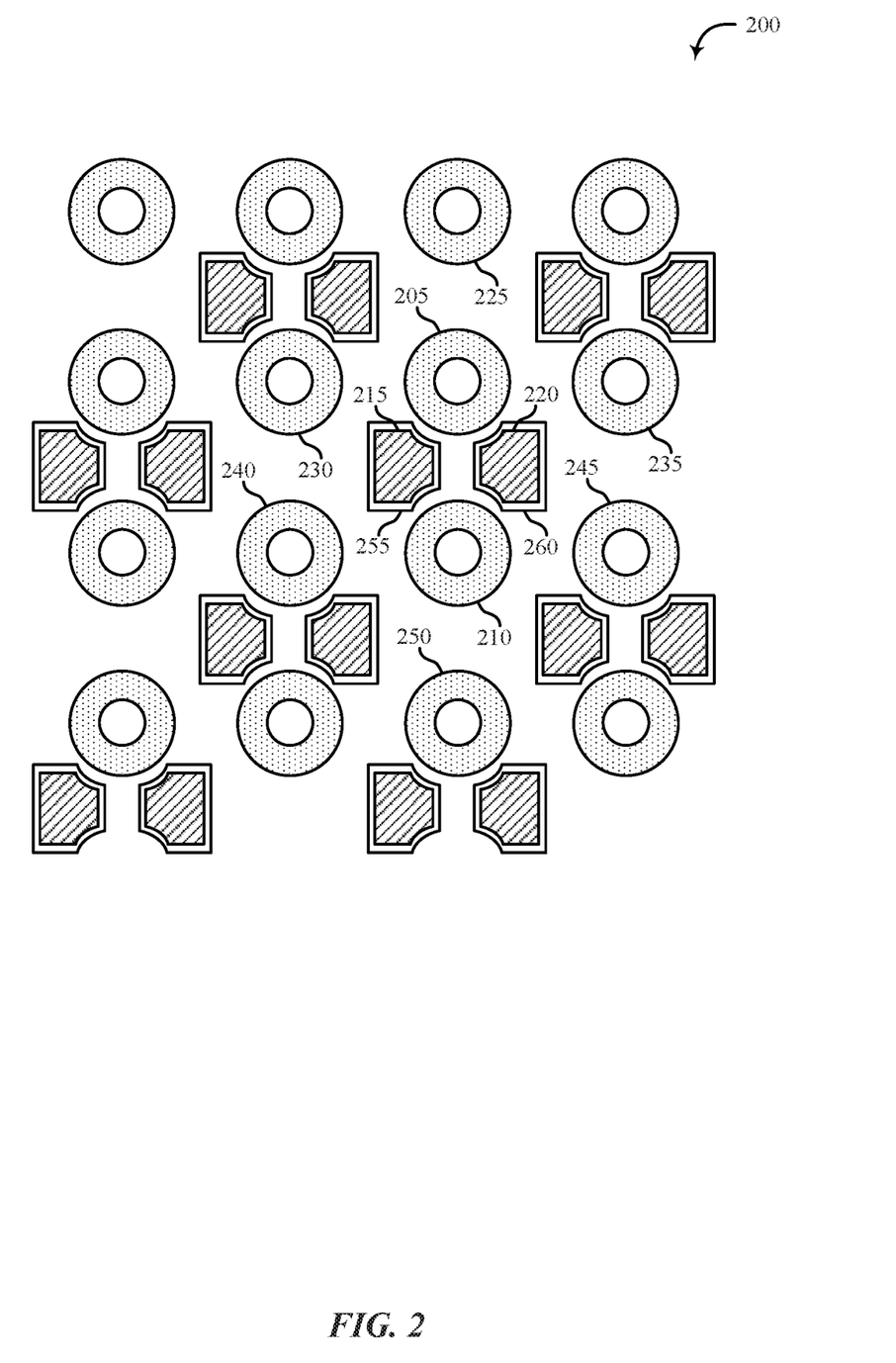
FIG. 2 shows another embodiment of an environment in accordance with various aspects of this disclosure.

FIG. 2 shows one embodiment of an environment 200 in accordance with various aspects of this disclosure. Environment 200 may be one example of environment 100 of FIG. 1. One or more aspects of the environment 200 may be implemented in conjunction with one or more processors of a computing device and/or one or more processors executing code in conjunction with a PCB fabrication machine.

Environment 200 depicts multiple vias and multiple conductive pads. In one embodiment, the depicted multiple vias and multiple conductive pads are shown relative to a bottom or top surface of a printed circuit board. For example, environment 200 may depict a layout of the multiple vias and the multiple conductive pads placed on a mounting surface of a printed circuit board. The multiple conductive pads may be placed on the mounting surface and the multiple vias may each include an aperture formed in the mounting surface.

The multiple vias include first via 205 and second via 210. The multiple vias may also include vias 225, 230, 235, 240, 245, and 250. In one embodiment, the description of first via 205 and second via 210 applies to the multiple vias shown. The multiple conductive pads include first pad 215 and second pad 220. In one embodiment, at least one of the multiple conductive pads includes electrically conductive material. In some cases, the first pad 215 and the second pad being spaced apart from the first via and the second via on the mounting surface.

As shown, the multiple vias positioned within environment 200 in a checkerboard layout. In some embodiments, the multiple conductive pads are interspersed throughout the multiple vias in an every-other-row layout. For example, the multiple conductive pads are interspersed among the multiple vias in every other row for a given column of vias. For instance, for the column of vias 225, 205, 210, and 250, there is no pad in the first depicted row of this column between via 225 and via 205, while first pad 215 and second pad 220 are positioned in the second depicted row of this column between via 205 and via 210. Then in the third depicted row of this column there is no pad between via 210 and via 250, and so forth.

In some embodiments, the multiple conductive pads are interspersed throughout the multiple vias in an every-other-column layout. For example, the multiple conductive pads are interspersed among the multiple vias in every other column for a given row of vias. For instance, for the row between vias 230 and 240, between vias 205 and 210, and between vias 235 and 245, there is no pad in the second depicted column of this row between via 230 and via 240, while first pad 215 and second pad 220 are positioned in the third depicted column of this row between via 205 and via 210. Then in the fourth depicted column of this row there is no pad between via 235 and via 245, and so forth.

In one embodiment, the first via 205 and second via 210 each include a reduced width portion positioned between and spaced apart from the first via 205 and the second via 210. A conventional pad may include a square or rectangular pad. As depicted, first pad 215 and second pad 220 may be referred to as semi-square or semi-rectangular. For example, the left side of first pad 215 as shown includes a top left square corner and a bottom left square corner, while on the right side where the square corners would be on a conventional pad, instead the right side of first pad 215 as shown includes a top right rounded and indented corner and a bottom right rounded and indented corner. Similarly, the right side of second pad 220 as shown includes a top right square corner and a bottom right square corner, while on the left side where the square corners would be on a conventional pad, instead the left side of second pad 220 as shown includes a top left rounded and indented corner and a bottom left rounded and indented corner.

As shown, first pad 215 includes a first solder mask 255 that surrounds first pad 215 and is relatively in the same shape as first pad 215. Similarly, second pad 220 includes a second solder mask 260 that surrounds second pad 220 and is relatively in the same shape as second pad 220.

In one embodiment, first pad 215 connects electrically to first via 205 and second pad connects 220 electrically to second via 210. For example, a conductive trace may run from first pad 215 to first via 205 on a top surface, on a bottom surface, or in between layers of the printed circuit board. Alternatively, first pad 215 connects electrically to second via 210 and second pad connects 220 electrically to first via 205. For example, a conductive trace may run from first pad 215 to second via 210 on a top surface, on a bottom surface, or in between layers of the printed circuit board.

In one embodiment, one end of an electronic component is connected to first pad 215 and another end of the electronic component is connected to second pad 220. In one embodiment, a first connector of the electronic component connects electrically to first pad 215 and a second connector of the electronic component connects electrically to second pad 220. As one example, the electronic component may include a capacitor, a resistor, or an inductor.

Figure 3:
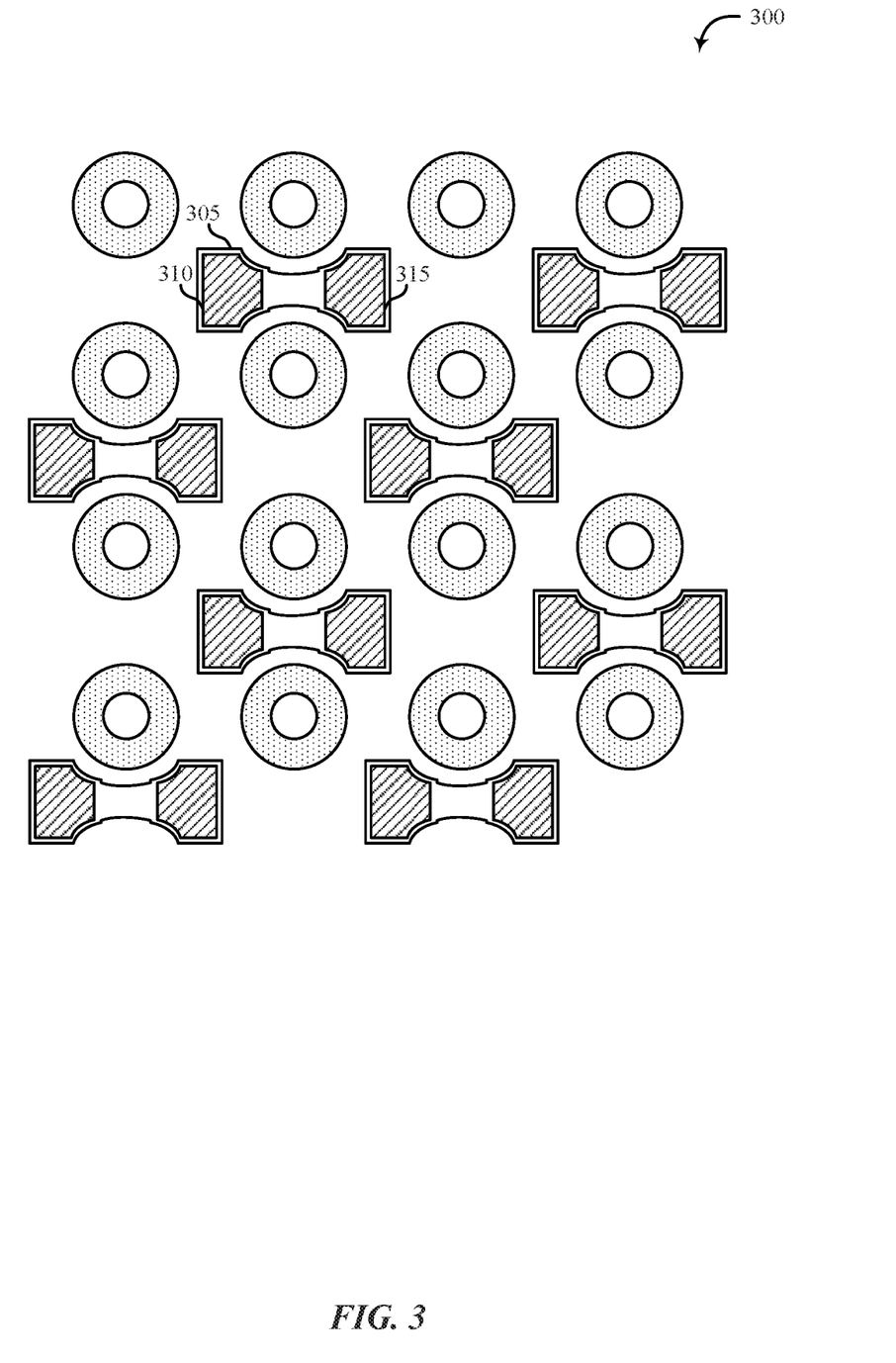
FIG. 3 shows another embodiment of an environment in accordance with various aspects of this disclosure.

FIG. 3 shows one embodiment of an environment 300 in accordance with various aspects of this disclosure. Environment 300 may be one example of environment 100 of FIG. 1 and/or environment 200 of FIG. 2. One or more aspects of the environment 300 may be implemented in conjunction with one or more processors of a computing device and/or one or more processors executing code in conjunction with a PCB fabrication machine.

Environment 300 depicts multiple vias and multiple pairs of conductive pads. In one embodiment, the depicted multiple vias and multiple pairs of conductive pads are on a bottom or top surface of a printed circuit board. The multiple pairs of conductive pads include a first pair of conductive pads, first pad 310 and second pad 315. As depicted, each pair of conductive pads includes a single solder mask. For example, first pad 310 and second pad 315 may share a single solder mask, solder mask 305. In one embodiment, at least some of the conductive pads of environment 200 and/or environment 300 may be solder mask defined (SMD) where the solder mask partially overlaps an associated pair of conductive pads. In some embodiments, at least some of the conductive pads of environment 200 and/or environment 300 may be non-solder mask defined (NSMD) where the solder mask stops a certain distance before an associated pair of conductive pads, leaving an exposed portion of the printed circuit board between the associated pair of conductive pads and the solder mask.

Figure 4A:
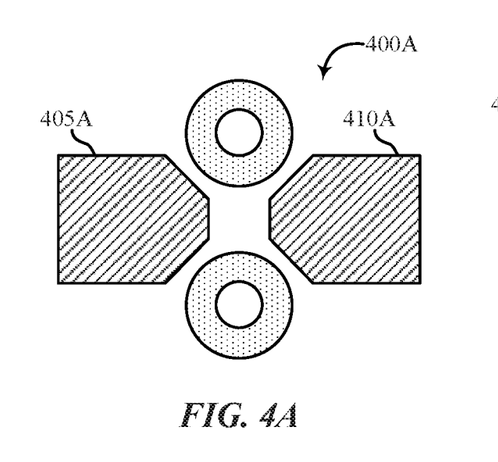
FIGS. 4A-4D show embodiments of multiple environments in accordance with various aspects of this disclosure.

FIG. 4A shows an environment 400A for fine pitch component placement on printed circuit boards, in accordance with various examples. Environment 400A may be one example of environment 100 of FIG. 1, environment 200 of FIG. 2, and/or environment 300 of FIG. 3. One or more aspects of the environment 400A may be implemented in conjunction with one or more processors of a computing device and/or one or more processors executing code in conjunction with a PCB fabrication machine. As illustrated, each of FIGS. 4A-4D depict first and second vias with first and second conductive pads. As illustrated in FIG. 4A, environment 400A depicts first and second vias associated with first pad 405A and second pad 410A. As shown, first pad 405A may be rectangular or square in shape with the two inside corners towards the first and second vias clipped. Similarly, second pad 410A may be rectangular or square in shape with the two inside corners towards the first and second vias clipped, resulting in first pad 405A and second pad 410A having six flat edges as shown.

Figure 4B:
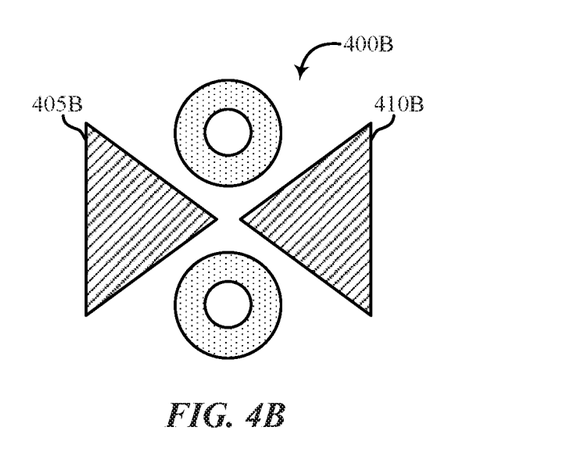

FIG. 4B shows an environment 400B for fine pitch component placement on printed circuit boards, in accordance with various examples. Environment 400B may be one example of environment 100 of FIG. 1, environment 200 of FIG. 2, and/or environment 300 of FIG. 3. One or more aspects of the environment 400B may be implemented in conjunction with one or more processors of a computing device and/or one or more processors executing code in conjunction with a PCB fabrication machine. Environment 400B depicts first and second vias associated with first pad 405B and second pad 410B. As shown, first pad 405B may have three edges and be triangular in shape with two sides of first pad 405B placed relatively close to the edges of the depicted first and second vias. Similarly, second pad 410B may have three edges and be triangular in shape with two sides of second pad 410B placed relatively close to the edges of the first and second vias. Although depicted with straight edges and sharp corners, in some cases, first pad 405B and/or second pad 410B may include rounded edges and/or rounded corners.

Figure 4C:
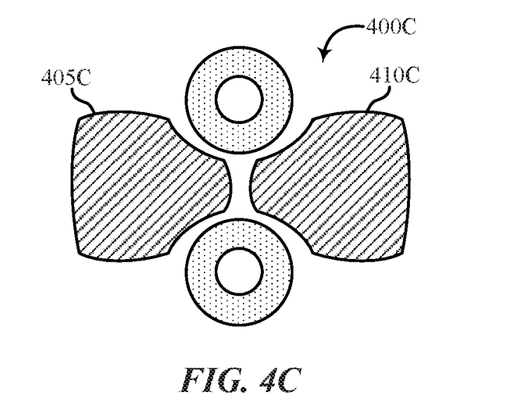

FIG. 4C shows an environment 400C for fine pitch component placement on printed circuit boards, in accordance with various examples. Environment 400C may be one example of environment 100 of FIG. 1, environment 200 of FIG. 2, and/or environment 300 of FIG. 3. One or more aspects of the environment 400C may be implemented in conjunction with one or more processors of a computing device and/or one or more processors executing code in conjunction with a PCB fabrication machine. Environment 400C depicts first and second vias associated with first pad 405C and second pad 410C. As shown, first pad 405C and second pad 410C may include rounded corners and/or rounded edges. In particular, first pad 405C may include six rounded edges and second pad 410C may include six rounded edges. As shown, the edge of first pad 405C facing the edge of second pad 410C may each be convex, while the two edges of first pad 405C closest to the first and second vias may be concave and similarly the two edges of second pad 410C closest to the first and second vias may be concave. In some cases, the concave edges of first pad 405C and second pad 410C may include a curvature relatively similar to the curvature of the depicted first and second vias.

Figure 4D:
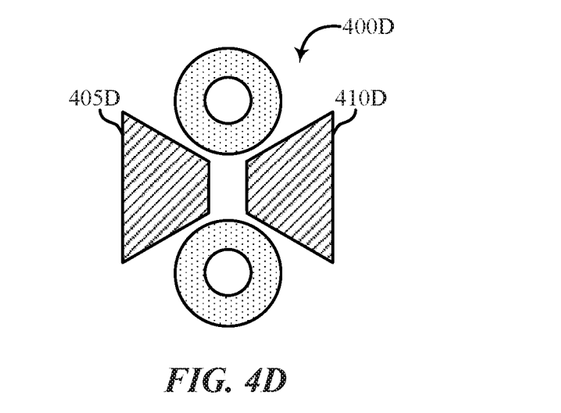

FIG. 4D shows an environment 400D for fine pitch component placement on printed circuit boards, in accordance with various examples. Environment 400D may be one example of environment 100 of FIG. 1, environment 200 of FIG. 2, and/or environment 300 of FIG. 3. One or more aspects of the environment 400D may be implemented in conjunction with one or more processors of a computing device and/or one or more processors executing code in conjunction with a PCB fabrication machine. Environment 400D depicts first and second vias associated with first pad 405D and second pad 410D. As shown, first pad 405D may include a quadrilateral pad and second pad 410D may include a quadrilateral pad. For example, first pad 405D and/or second pad 410D may include a conductive pad in the shape of a trapezoid, an isosceles trapezoid, a rhombus, a parallelogram, and so on.

In some embodiments, a fabrication machine may be used to build one or more aspects of the environments of FIGS. 4A-4D. A fabrication machine may include one or more processors, memory, and/or storage. A fabrication machine may include one or more buses to enable data communication between one or more elements of the fabrication machine such as one or more processors, storage device, memory, or any combination thereof. The memory of the fabrication machine may include random access memory (RAM), read only memory (ROM), flash memory, and/or other types. The memory may store computer-readable, computer-executable software/firmware code including instructions that, when executed, cause one or more processors to perform various functions described in this disclosure. Alternatively, the software/firmware code may not be directly executable by the one or more processors but may cause a computer (when compiled and executed, for example) to perform functions described herein. The one or more processors may include an intelligent hardware device, for example, a central processing unit (CPU), a microcontroller, an application-specific integrated circuit (ASIC), field programmable gate array (FPGA), or any combination thereof.

Figure 5:
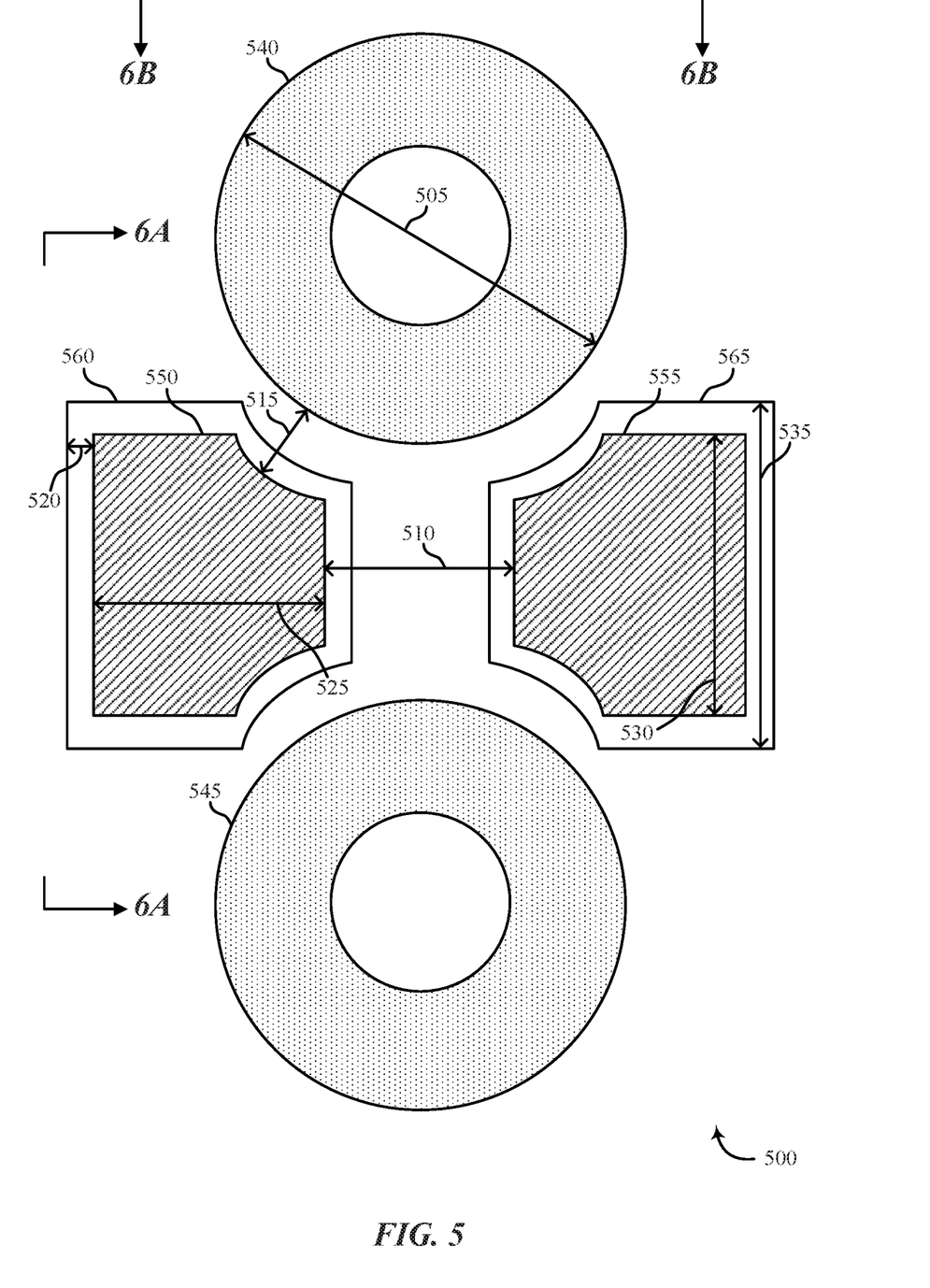
FIG. 5 shows another embodiment of an environment in accordance with various aspects of this disclosure.

FIG. 5 shows an environment 500 for fine pitch component placement on printed circuit boards, in accordance with various examples. Environment 500 may be one example of environment 100 of FIG. 1, environment 200 of FIG. 2, environment 300 of FIG. 3, and/or one or more of the illustrated environments of FIGS. 4A-4D. At least one aspect of environment 500 may be implemented in conjunction with one or more processors of a computing device and/or one or more processors executing code in conjunction with a PCB fabrication machine.

As depicted, environment 500 may include first via 540, second via 545, first pad 550, second pad 555, first solder mask 560, and second solder mask 565. The illustrated view of first via 540, second via 545, first pad 550, second pad 555, first solder mask 560, and second solder mask 565 may be one example of a view of these elements on a surface of a printed circuit board. The first via 540 and second via 545 may be examples of vias from FIGS. 2, 3, 4, and/or 5, and first pad 550 and second pad 555 may be examples of pads from FIGS. 2, 3, 4, and/or 5, etc.

In the illustrated example, the first pad 550 and the second pad 555 (and first solder mask 560 and second solder mask 565) each include six edges. As shown, the six edges of each pad include four straight edges and two curved edges. As shown, the first and second edges of each pad have a contoured or curved shape. In some cases, a curvature of at least one of the two or more curved edges matches a curvature of at least one of the first via 540 or the second via 545, or a curvature of both the first via 540 and the second via 545. In one embodiment, the two or more curved edges may be positioned spatially between the first via and the second via.

As shown, first via 540, second via 545, first pad 550, second pad 555, first solder mask 560, and second solder mask 565 may each be configured with certain dimensions and may be placed on a printed circuit board with certain dimensions relative to each other. In one example, first via 540 and second via 545 may be part of a BGA via pitch of 31.5 mils (0.8 mm). In the illustrated example, first via 540 may have a finished pad diameter 505 of 19 mils as shown (e.g., from edge to edge of annular ring). In some cases, first via 540 may also have a drill diameter of 10 mils with a 14 mil solder mask diameter. In some cases, finished pad diameter 505 may range anywhere between 14 mils and 24 mils, with a drill diameter of anywhere between 5 mils and 15 s mils, and a solder mask diameter anywhere between 9 mils and 19 mils. In some cases, second via 545 may have a similar finished pad diameter within the range of 14 mils to 24 mils, a drill diameter of anywhere between 5 mils and 15 s mils, and a solder mask diameter anywhere between 9 mils and 19 mils.

As shown, first pad 550 and second pad 555 may have a pad gap 510 between them. In one example, the pad gap 510 may be 9 mils (e.g., for a 0201 device designs). In one embodiment, the pad gap 510 may be anywhere from 4 mils to 14 mils. As illustrated, first pad 550 and first via 540 may have a pad to via gap 515 between them. In one embodiment, the pad to via gap 515 may be 4.5 mils from curved edge of first pad 550 to annular ring of first via 540 (e.g., edge of finished pad diameter 505). The pad to via gap 515 may be anywhere from 3 mils to 6 mils. As shown, another pad to via gap may exist between first pad 550 and second via 545, as well as pad to via gaps between second pad 555 and first via 540 and between second pad 555 and second via 545.

As illustrated, first pad 550 and first solder mask 560 may have a pad to solder mask gap 520. In one embodiment, the pad to solder mask gap 520 may be 2 mils. In some embodiments, the pad to solder mask gap 520 may be 2 mils beyond one or more edges of first pad 550. In some cases, the pad to solder mask gap 520 may range from 1 mil to 3 mils. In some cases, a similar pad to solder mask gap of solder mask 565 may surround second pad 555 within the range of 1 mil to 3 mils.

As shown, first pad 550 may have a pad width 525. In one embodiment, pad width 525 may be 13 mils. In some cases, pad width may range from 8 mils to 18 mils. In one example, second pad 555 may have a similar pad width within the range of 8 mils to 18 mils. As shown, second pad 555 may have a pad height 530. In one embodiment, pad height 530 may be 15 mils. In one example, the pad height 530 may be 15 mils for 0201 device designs. In some cases, pad height 530 may range from 10 mils to 20 mils. In one example, first pad 550 may have a similar pad height within the range of 10 mils to 20 mils. As illustrated, second solder mask 565 may have a solder mask height 535. In one embodiment, solder mask height 535 may be 19 mils (e.g., for 0201 device designs). In some cases, solder mask height 535 may range anywhere from 14 mils to 24 mils. In one example, first solder mask 560 may have a solder mask height within the range of 14 mils to 24 mils.

Figure 6A:
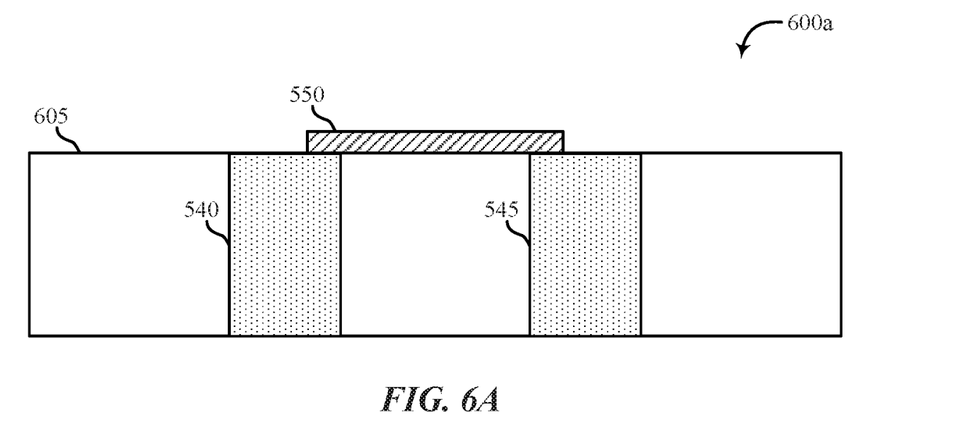
FIGS. 6A and 6B show embodiments of multiple perspectives of environments in accordance with various aspects of this disclosure.

FIG. 6A shows a first view 600*a* relative to fine pitch component placement on printed circuit boards, in accordance with various examples. First view 600*a* may be one example of a view of environment 100 of FIG. 1, environment 200 of FIG. 2, environment 300 of FIG. 3, one or more of the illustrated environments of FIGS. 4A-4D, and/or environment 500 of FIG. 5. For example, first view 600*a* may be a view of environment 500 from the perspective indicated from the 6A arrows of FIG. 5. At least one aspect of elements from first view 600*a* may be implemented in conjunction with one or more processors of a computing device and/or one or more processors executing code in conjunction with a PCB fabrication machine.

As depicted, first view 600*a* may include printed circuit board 605. First view 600*a* of printed circuit board 605 may include a view of first via 540 and second via 545. Printed circuit board 605 may include additional vias as well. As shown, first via 540 may include a first hole drilled through printed circuit board 605 from a top surface to a bottom surface of printed circuit board 605. Also, second via 545 may include a second hole drilled through printed circuit board 605 from a top surface to a bottom surface of printed circuit board 605. In some cases, printed circuit board 605 may include one or more internal layers between a top surface of printed circuit board 605 and bottom surface of printed circuit board 605. For example, printed circuit board 605 may include one or more ground planes, one or more power planes, or one or more signal layers with internal conductive traces, or any combination thereof.

Printed circuit board 605 may include first pad 550 placed on a surface of printed circuit board 605. First pad 550 may be placed on a top surface or a bottom surface of printed circuit board 605. Printed circuit board 605 may include additional conductive pads. As shown, a width of at least a portion of first pad 550 may extend beyond a gap between first via 540 and second via 545. As shown, a width of at least a portion of first pad 550 may extend beyond an inner edge of first via 540 and beyond an inner edge of second via 545 from the perspective of first view 600*a*.

Figure 6B:
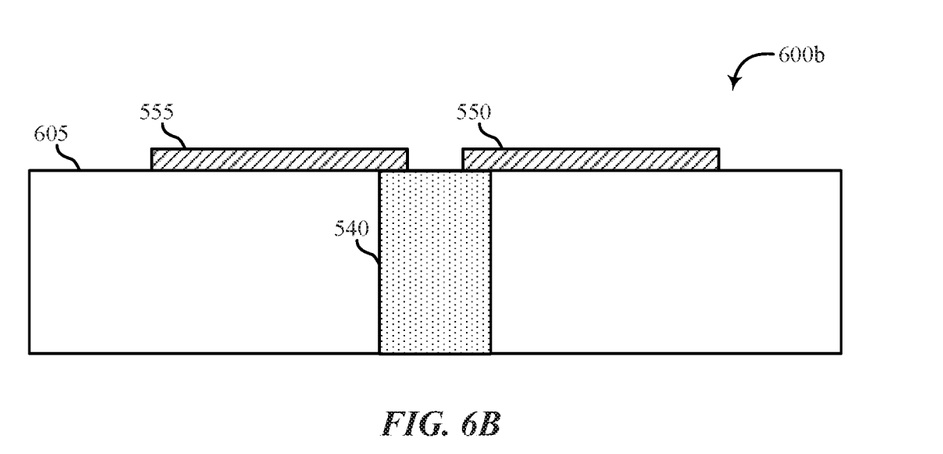

FIG. 6B shows a second view 600*b* relative to fine pitch component placement on printed circuit boards, in accordance with various examples. Second view 600*b* may be one example of a view of environment 100 of FIG. 1, environment 200 of FIG. 2, environment 300 of FIG. 3, one or more of the illustrated environments of FIGS. 4A-4D, and/or environment 500 of FIG. 5. For example, second view 600*b* may be a view of environment 500 from the perspective indicated from the 6B arrows of FIG. 5. At least one aspect of elements from second view 600*b* may be implemented in conjunction with one or more processors of a computing device and/or one or more processors executing code in conjunction with a PCB fabrication machine.

As depicted, second view 600*b* may include printed circuit board 605. Second view 600*b* of printed circuit board 605 may include a view of first via 540. Printed circuit board 605 may include additional vias as well. As shown, first via 540 may include a first hole drilled through printed circuit board 605 from a top surface to a bottom surface of printed circuit board 605.

Printed circuit board 605 may include first pad 550 and second pad 555 placed on the same surface of printed circuit board 605. First pad 550 and second pad 555 may be placed on a top surface or a bottom surface of printed circuit board 605. Printed circuit board 605 may include additional conductive pads. As shown, a width of at least a portion of first via 540 may extend beyond a gap between first pad 550 and second pad 555. As shown, a width of at least a portion of first via 540 may extend beyond an inner edge of first pad 550 and an inner edge of second pad 555 from the perspective of second view 600*b*.

Figure 7:
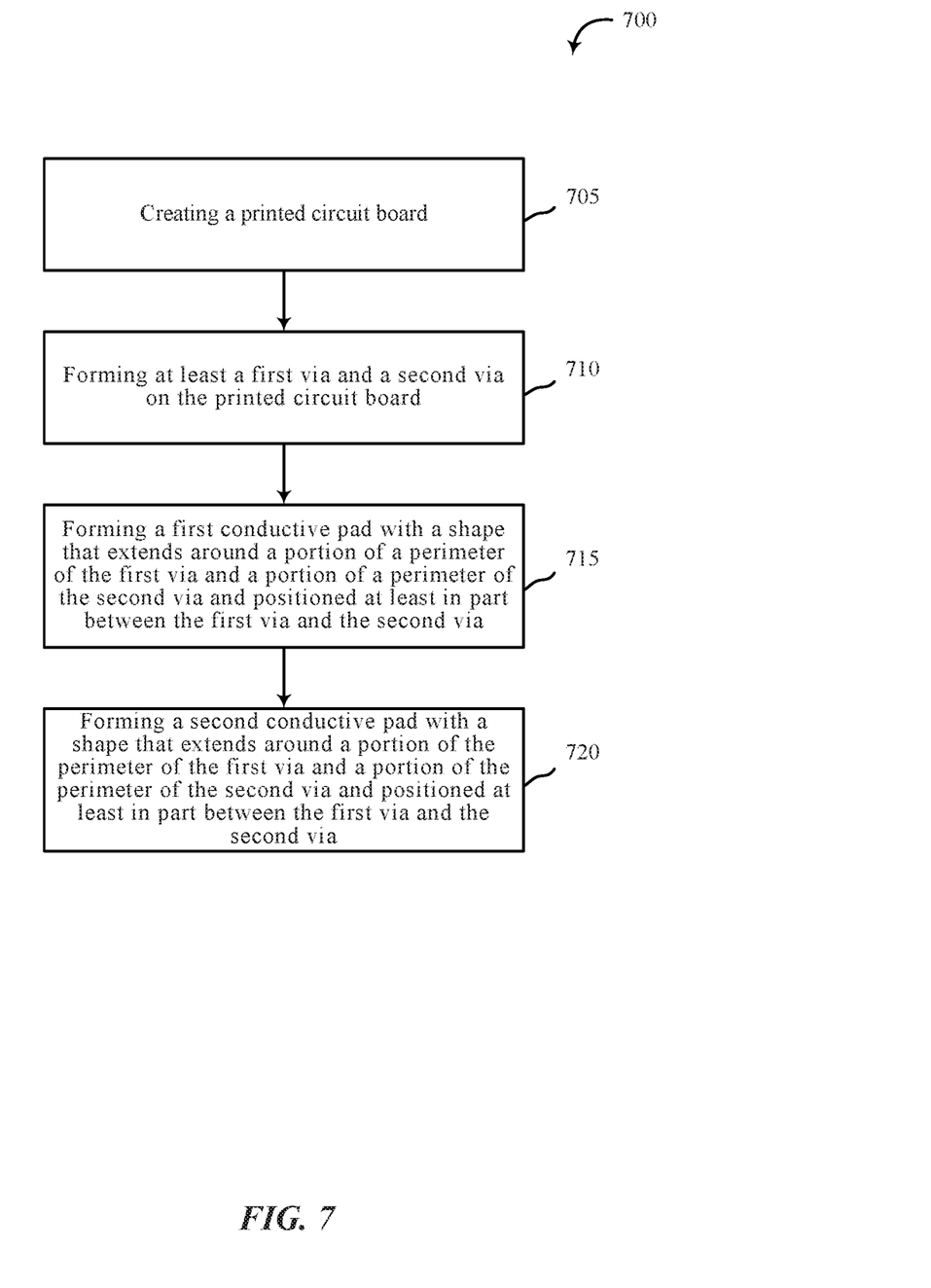
FIG. 7 is a flow chart illustrating an example of a method in accordance with various aspects of this disclosure.

FIG. 7 is a flow chart illustrating an example of a method 700 for fine pitch component placement on printed circuit boards, in accordance with various aspects of the present disclosure. One or more aspects of the method 700 may be implemented in conjunction with a PCB fabrication machine. In some cases, the PCB fabrication machine may include a PCB film generator, an ultraviolet exposure machine, an electroplating machine, a drilling machine, a milling machine, a chemical etching machine, a laser etching machine, or any combination thereof. In some cases, the PCB fabrication machine may include one or more devices configured to fabricate a PCB, to place one or more conductive pads on the surface of the PCB, to place one or more conductive traces on and/or in the PCB, to drill one or more vias into the PCB, to plate the one or more vias with a conductive material, and so forth. In some cases, the PCB fabrication machine may be configured to fabricate a PCB based at least in part on surface mount technology (SMT). In some cases, the PCB fabrication machine may place one or more surface mount components on the PCB such as surface mount resistors, surface mount capacitors, and/or surface mount inductors.

In some examples, a computing device may execute one or more sets of codes to control the functional elements of the a machine configured to implement one or more actions or functions described with reference to FIG. 7. In some cases, a computing device and/or PCB fabrication machine may perform one or more of the functions described below using special-purpose hardware such as one or more application-specific integrated circuits (ASICs) adapted to perform some or all of the applicable functions in hardware. Alternatively, the functions may be performed by one or more other processing units (or cores), on one or more integrated circuits. In other examples, other types of integrated circuits may be used such as Structured/Platform ASICs, Field Programmable Gate Arrays (FPGAs), and other Semi-Custom ICs, which may be programmed in any manner known in the art. The functions of each module, component, block, and/or element of the figures and accompanying description may also be implemented, in whole or in part, with instructions embodied in memory formatted to be executed by one or more general and/or application-specific processors.

At block 705, method 700 may include creating a printed circuit board. The printed circuit board may include one or more layers and include a top surface and a bottom surface.

At block 710, method 700 may include forming at least a first via and a second via on the printed circuit board. The method 700 may include forming multiple vias on the printed circuit board that include the first and second vias.

At block 715, method 700 may include forming a first conductive pad on the top surface or the bottom surface of the printed circuit board. Method 700 may include forming the first conductive pad with a shape that extends around a portion of a perimeter of the first via. Additionally or alternatively, method 700 may include forming the first conductive pad with a shape that extends around a portion of a perimeter of the second via. In some cases, method 700 may include positioning the first conductive pad at least in part between the first via and the second via.

At block 720, method 700 may include forming a second conductive pad on the top surface or the bottom surface of the printed circuit board. Method 700 may include forming the second conductive pad with a shape that extends around a portion of a perimeter of the first via. Additionally or alternatively, method 700 may include forming the second conductive pad with a shape that extends around a portion of a perimeter of the second via. In some cases, method 700 may include positioning the second conductive pad at least in part between the first via and the second via. The method 700 may include forming multiple conductive pads on the printed circuit board that include the first and second conductive pads. The multiple conductive pads may be formed on the top surface and/or the bottom surface of the printed circuit board.

The operation(s) at block 705-720 may be performed using one or more processors of one or more computer devices and/or computer-controlled devices such as a PCB fabrication machine. The method 700 may provide for fine pitch component placement on printed circuit boards. It should be noted that the method 700 is just one implementation and that the operations of the method 700 may be rearranged, omitted, and/or otherwise modified such that other implementations are possible and contemplated.

In some examples, aspects from two or more elements of the method 700 may be combined and/or separated. It should be noted that the method 700 is just one example implementation, and that the operations of the method 700 may be rearranged or otherwise modified such that other implementations are possible.

The detailed description set forth above in connection with the appended drawings describes examples and does not represent the only instances that may be implemented or that are within the scope of the claims. The terms "example" and "exemplary," when used in this description, mean "serving as an example, instance, or illustration," and not "preferred" or "advantageous over other examples." The detailed description includes specific details for the purpose of providing an understanding of the described techniques. These techniques, however, may be practiced without these specific details. In some instances, known structures and apparatuses are shown in block diagram form in order to avoid obscuring the concepts of the described examples.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks, layouts, configurations, and/or components described in connection with this disclosure may be implemented or performed with a general-purpose processor, a digital signal processor (DSP), an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, and/or state machine. A processor may also be implemented as a combination of computing devices, for example, a combination of a DSP and a microprocessor, multiple microprocessors, one or more microprocessors in conjunction with a DSP core, and/or any combination thereof.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope and spirit of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

As used herein, including in the claims, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination. Also, as used herein, including in the claims, "or" as used in a list of items (for example, a list of items prefaced by a phrase such as "at least one of" or "one or more of") indicates a disjunctive list such that, for example, a list of "at least one of A, B, or C" means A or B or C or AB or AC or BC or ABC, or A and B and C.

In addition, any disclosure of components contained within other components or separate from other components should be considered exemplary because multiple other architectures may potentially be implemented to achieve the same functionality, including incorporating all, most, and/or some elements as part of one or more unitary structures and/or separate structures.

Computer-readable media includes both computer storage media and communication media including any medium that facilitates transfer of a computer program from one place to another. A storage medium may be any available medium that can be accessed by a general purpose or special purpose computer. By way of example, and not limitation, computer-readable media can comprise RAM, ROM, EEPROM, flash memory, CD-ROM, DVD, or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, or any combination thereof, then the coaxial cable, fiber optic cable, twisted pair, DSL, or wireless technologies such as infrared, radio, and/or microwave are included in the definition of medium. Disk and disc, as used herein, include any combination of compact disc (CD), laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The previous description of the disclosure is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed.

This disclosure may specifically apply to security system applications. This disclosure may specifically apply to storage system applications. In some embodiments, the concepts, the technical descriptions, the features, the methods, the ideas, and/or the descriptions may specifically apply to storage and/or data security system applications. Distinct advantages of such systems for these specific applications are apparent from this disclosure.

The process parameters, actions, and steps described and/or illustrated in this disclosure are given by way of example only and can be varied as desired. For example, while the steps illustrated and/or described may be shown or discussed in a particular order, these steps do not necessarily need to be performed in the order illustrated or discussed. The various exemplary methods described and/or illustrated here may also omit one or more of the steps described or illustrated here or include additional steps in addition to those disclosed.

Furthermore, while various embodiments have been described and/or illustrated here in the context of fully functional computing systems, one or more of these exemplary embodiments may be distributed as a program product in a variety of forms, regardless of the particular type of computer-readable media used to actually carry out the distribution. The embodiments disclosed herein may also be implemented using software modules that perform certain tasks. These software modules may include script, batch, or other executable files that may be stored on a computer-readable storage medium or in a computing system. In some embodiments, these software modules may permit and/or instruct a computing system to perform one or more of the exemplary embodiments disclosed here.

This description, for purposes of explanation, has been described with reference to specific embodiments. The illustrative discussions above, however, are not intended to be exhaustive or limit the present systems and methods to the precise forms discussed. Many modifications and variations are possible in view of the above teachings. The embodiments were chosen and described in order to explain the principles of the present systems and methods and their practical applications, to enable others skilled in the art to utilize the present systems, apparatus, and methods and various embodiments with various modifications as may be suited to the particular use contemplated.

What is claimed is:

1. A printed circuit board comprising:
a plurality of vias comprising at least a first via and a second via; and
a first pad and a second pad each comprising an electrically conductive material, the first pad and the second pad each having a reduced width portion positioned between and spaced apart from the first via and the second via, the first pad and the second pad each including at least six edges, the at least six edges including four or more straight edges and two or more curved edges, a curvature of at least one of the two or more curved edges matching a curvature of at least one of the first via and the second via, or a curvature of both the first via and the second via, and
a single solder mask that surrounds the first pad and the second pad, the single solder mask including a reduced width portion positioned between the first pad and the second pad.

2. The printed circuit board of claim 1, wherein the second pad mirrors the first pad.

3. The printed circuit board of claim 2, wherein the first via mirrors the second via.

4. The printed circuit board of claim 3, wherein a mirror line of the first pad and the second pad is orthogonal to a mirror line of the first via and the second via.

5. The printed circuit board of claim 1, wherein the reduced width portion includes a first edge that extends along a portion of a peripheral edge of the first via, and a second edge that extends along a portion of a peripheral edge of the second via.

6. The printed circuit board of claim 1, wherein the first pad connects electrically to the first via, and the second pad connects electrically to the second via.

7. The printed circuit board of claim 1, wherein an electronic component is connected to the first pad and to the second pad, the electronic component comprising a capacitor, a resistor, or an inductor.

8. The printed circuit board of claim 7, wherein a first connector of the electronic component connects electrically to the first pad and a second connector of the electronic component connects electrically to the second pad.

9. The printed circuit board of claim 5, wherein the first and second edges have a contoured shape.

10. The printed circuit board of claim 1, further comprising a mounting surface, the first pad and the second pad being positioned on the mounting surface and the first via and the second via each including a hole through the printed circuit board from the mounting surface to a second surface of the printed circuit board, the first pad and the second pad being spaced apart from the first via and the second via on the mounting surface.

11. A printed circuit board comprising:
a plurality of vias arranged in a layout of columns and rows on printed circuit board and comprising at least a first via and a second via provided adjacent to one another within a first column of vias; and
a first pad and a second pad each comprising an electrically conductive material, the first pad and the second pad from a plurality of pads that are interspersed within the layout of vias, each of the first and second pad having a reduced width portion positioned between and spaced apart from the first via and the second via, a first pad to via gap between the first via and the first pad being substantially equal to a second pad to via gap between the second via and the second pad, the plurality of pads being interspersed among the plurality of vias in between every other row of vias for a given column of vias with the first and second pads between the first and second vias of the first column of vias and with no pads provided in a space between an adjacent pair of vias of an adjacent second column of vias.

12. The printed circuit board of claim 11, wherein the reduced width portion includes a first edge that extends along a portion of a peripheral edge of the first via, and a second edge that extends along a portion of a peripheral edge of the second via.

13. A printed circuit board comprising:
a plurality of vias comprising at least a first via and a second via; and
a first pad and a second pad each comprising an electrically conductive material, the first ad and the second pad each having a reduced width portion positioned between and spaced apart from the first via and the second via, the first pad and the second pad each including at least six edges, the at least six edges including four or more straight edges and two or more curved edges, a curvature of at least one of the two or more curved edges matching a curvature of at least one of the first via and the second via, or a curvature of both the first via and the second via, and wherein the first pad is separated from a nearest adjacent pad by a pad gap ranging from 4 mils to 14 mils, the pad gap being positioned between the first via and the second via.

14. The printed circuit board of claim 13, wherein the nearest adjacent pad is the second pad.

15. The printed circuit board of claim 13, further comprising a first solder mask surrounding the first pad and a second solder mask surrounding the second pad, the first solder mask being spaced apart from the second solder mask.

16. A printed circuit board comprising:
a plurality of vias comprising at least a first via and a second via; and
a first pad and a second pad each comprising an electrically conductive material, the first pad and the second pad each having a reduced width portion positioned between and spaced apart from the first via and the second via, the first pad and the second pad each including at least six edges, the at least six edges including four or more straight edges and two or more curved edges, a curvature of at least one of the two or more curved edges matching a curvature of at least one of the first via and the second via, or a curvature of both the first via and the second via, and further comprising a first solder mask surrounding the first pad and a second solder mask surrounding the second pad, the first solder mask and the second solder mask each including at least six edges, the at least six edges including four or more straight edges and two or more curved edges.

* * * * *

UNITED STATES PATENT AND TRADEMARK OFFICE
CERTIFICATE OF CORRECTION

PATENT NO. : 10,729,050 B2
APPLICATION NO. : 15/814733
DATED : July 28, 2020
INVENTOR(S) : Vimal Cyril and Subramanian Ramanathan It is certified that error appears in the above-identified patent and that said Letters Patent is hereby corrected as shown below:

In the Claims

Column 14, Claim 13, Line 67, "ad" should be --pad--.

Signed and Sealed this
Fifteenth Day of September, 2020

Andrei Iancu
*Director of the United States Patent and Trademark Office*